United States Patent
Lee

(10) Patent No.: US 9,299,751 B2
(45) Date of Patent: Mar. 29, 2016

(54) DISPLAY DEVICE

(71) Applicant: SAMSUNG DISPLAY CO., LTD., Yongin, Gyeonggi-Do (KR)

(72) Inventor: Kang-Yong Lee, Yongin (KR)

(73) Assignee: SAMSUNG DISPLAY CO., LTD., Yongin, Gyeonggi-Do (KR)

( * ) Notice: Subject to any disclaimer, the term of this patent is extended or adjusted under 35 U.S.C. 154(b) by 0 days.

(21) Appl. No.: 14/520,529

(22) Filed: Oct. 22, 2014

(65) Prior Publication Data

US 2015/0115297 A1 Apr. 30, 2015

(30) Foreign Application Priority Data

Oct. 28, 2013 (KR) .......................... 10-2013-0128316

(51) Int. Cl.
*H01L 29/20* (2006.01)
*H01L 27/32* (2006.01)
*G06F 1/16* (2006.01)
*H01L 51/52* (2006.01)

(52) U.S. Cl.
CPC ............ *H01L 27/323* (2013.01); *G06F 1/1601* (2013.01); *H01L 27/3206* (2013.01); *H01L 51/5275* (2013.01); *H01L 51/5246* (2013.01)

(58) Field of Classification Search
CPC ........................ H01L 51/5246; H01L 51/5275
See application file for complete search history.

(56) References Cited

U.S. PATENT DOCUMENTS

| | | | | |
|---|---|---|---|---|
| 5,739,880 A * | 4/1998 | Suzuki | ............. | G02F 1/133512 349/110 |
| 2001/0028428 A1* | 10/2001 | Yamada | ................ | G02F 1/1393 349/123 |
| 2009/0284956 A1* | 11/2009 | Gomi | .................... | G02B 6/0018 362/97.3 |
| 2011/0242020 A1* | 10/2011 | Kang | ...................... | G06F 3/044 345/173 |
| 2012/0062486 A1* | 3/2012 | Rho | ........................ | G06F 3/041 345/173 |
| 2013/0120328 A1 | 5/2013 | Lee et al. | | |
| 2013/0293801 A1* | 11/2013 | Okada | .................... | G02F 1/1339 349/43 |
| 2015/0015621 A1* | 1/2015 | Atkinson | ............. | G09G 3/3413 345/690 |

FOREIGN PATENT DOCUMENTS

| | | |
|---|---|---|
| KR | 10-2006-0058466 A | 5/2006 |
| KR | 10-2010-0082667 A | 7/2010 |
| KR | 10-2011-0010846 U | 11/2011 |

* cited by examiner

*Primary Examiner* — William F Kraig
*Assistant Examiner* — Khatib Rahman
(74) *Attorney, Agent, or Firm* — Lee & Morse, P.C.

(57) ABSTRACT

A display device may include a display panel, a window substrate and a light shielding member. The display panel may include an active area in which pixels are disposed, and a non-active area at the periphery of the active area. The window substrate may be disposed above the display panel, and may include a frame pattern layer formed thereon. In the window substrate, the frame pattern layer may cover a portion including an outer edge in the non-active area. The light shielding member may include a light shielding sheet disposed below the display panel, and an adhesive layer disposed between the light shielding sheet and the display panel. In the display device, the adhesive layer includes an opening formed in at least one area between the frame pattern layer and the active area in an area corresponding to the non-active area.

12 Claims, 5 Drawing Sheets

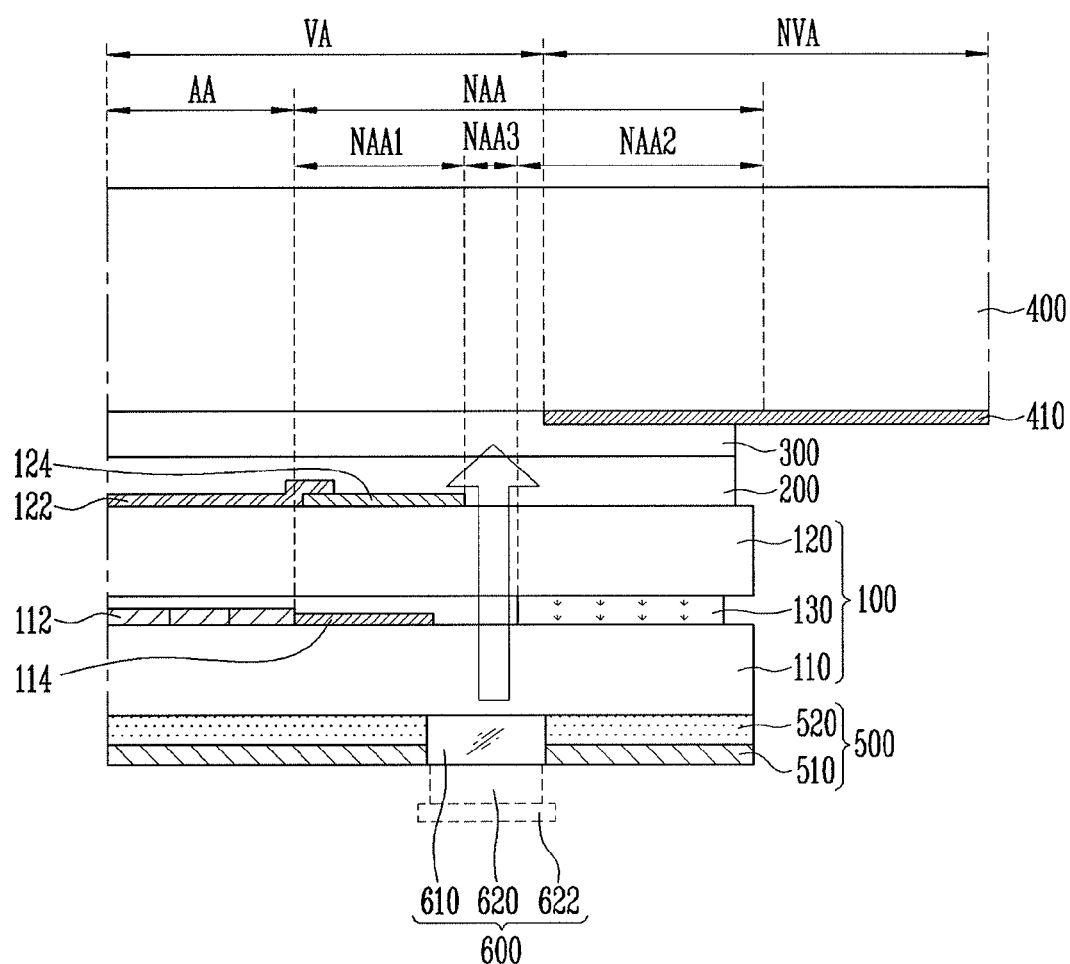

DISPLAY DEVICE

CROSS-REFERENCE TO RELATED APPLICATION

Korean Patent Application No. 10-2013-0128316 filed on Oct. 28, 2013, in the Korean Intellectual Property Office, and entitled: "DISPLAY DEVICE," is incorporated by reference herein in its entirety.

BACKGROUND

1. Field

Embodiments relate to a display device.

2. Description of the Related Art

A display device may include an active area in which pixels are disposed to constitute a screen, and a non-active area at the periphery of the active area. A plurality of lines for transmitting a driving signal to the pixels, a sealing material for bonding together two substrates constituting a display panel, and the like may be disposed in the non-active area.

SUMMARY

A display device may include a display panel including an active area including pixels and a non-active area at the periphery of the active area, a window substrate above the display panel, the window substrate including a frame pattern layer formed thereon, wherein the frame pattern layer covers a portion including an outer edge of the non-active area, and a light shielding member including a light shielding sheet below the display panel and an adhesive layer between the light shielding sheet and the display panel. The adhesive layer may include an opening formed in at least one area between the frame pattern layer and the active area in an area corresponding to the non-active area.

The opening may have a shape surrounding the periphery of the active area and may have a pattern corresponding to a boundary line at the periphery of the active area.

The non-active area may include a first non-active area including a plurality of lines, a second non-active area including a sealing material at an outside of the first non-active area, and a third non-active area between the first and second non-active areas.

The opening may overlaps at least the third non-active area. The opening may also overlap at least portions of the lines and the sealing material. The opening may overlap the entire third non-active area and overlap with portions of the first and second non-active areas adjacent to the third non-active area.

The frame pattern layer may cover at least one portion of the second non-active area. The frame pattern layer may also overlap at least one portion of the sealing material.

The light shielding sheet may include an opening corresponding to the opening of the adhesive layer.

The display device may further include a decorative lighting unit including a light guide film in the openings of the light shielding sheet and the adhesive layer, and a light source for supplying light to the light guide film. The light source may be below at least one side of the light guide film. The light source may include one or more color light emitting diodes (LEDs).

The display panel may further include upper and lower substrates, a sealing material bonding together the upper and lower substrates in an edge area between the upper and lower substrates, and touch sensing patterns on the upper substrate. The touch sensing patterns may include touch sensing electrodes in the active area and touch sensing lines in the non-active area to be connected to the touch sensing electrodes.

The opening may overlap an area between an area including the touch sensing lines and an area including the sealing material. The opening may extend to overlap with at least portions of the touch sensing lines and the sealing material and covers an area between an area including the touch sensing lines and an area including the sealing material.

BRIEF DESCRIPTION OF THE DRAWINGS

Features will become apparent to those of ordinary skill in the art by describing in detail exemplary embodiments with reference to the attached drawings in which:

FIG. 5 illustrates a main portion sectional view of the display device shown in FIG. 4.

DETAILED DESCRIPTION

Figure 1:
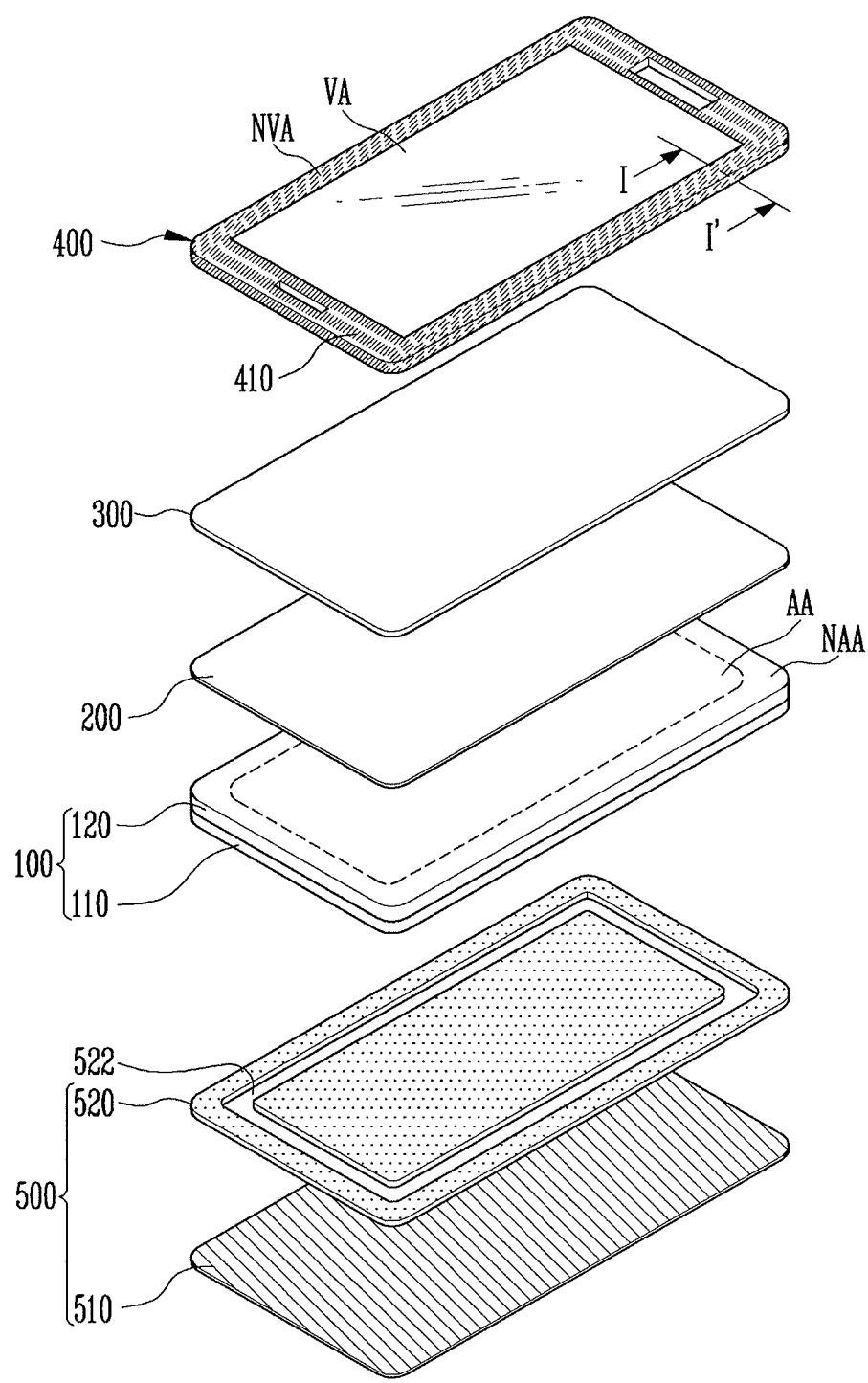
FIG. 1 illustrates an exploded perspective view of a display device according to an embodiment.

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey exemplary implementations to those skilled in the art.

In the drawing figures, the dimensions of layers and regions may be exaggerated for clarity of illustration. It will also be understood that when a layer or element is referred to as being "on" another layer or substrate, it can be directly on the other layer or substrate, or intervening layers may also be present. In addition, it will also be understood that when an element is referred to as being "between" two elements, it can be the only element between the two layers, or one or more intervening elements may also be present. Also, when an element is referred to as being "connected to" another element, it can be directly connected to the another element or be indirectly connected to the another element with one or more intervening elements interposed therebetween.

In the following detailed description, only certain exemplary embodiments have been shown and described, simply by way of illustration. As those skilled in the art would realize, the described embodiments may be modified in various different ways, all without departing from the spirit or scope of embodiments.

FIG. 1 is an exploded perspective view of a display device according to an embodiment.

Referring to FIG. 1, the display device according to this embodiment may include a display panel 100 for displaying an image, a polarizing plate 200, an adhesive 300 and a window substrate 400, which are sequentially disposed on the display panel 100, and a light shielding member 500 disposed beneath the display panel 100.

The display panel 100 may include a lower substrate 110 and an upper substrate 120, and at least pixels (not shown) may be disposed in an active area AA between the lower and upper substrates 110 and 120. In addition, a non-active area NAA may be defined at the periphery of the active area AA, and a plurality of lines (not shown) for supplying a driving signal to the pixels may be disposed in the non-active area NAA.

The display panel 100 may also be implemented as a display panel integrated with a touch screen. In this case, touch sensing patterns (not shown) for touch sensing may be formed on at least one of the lower and upper substrates 110 and 120. For example, the touch sensing patterns may be formed on the upper substrate 120.

The polarizing plate 200 may be disposed on the display panel 100 and control the transmission and/or reflection of light incident from the display panel 100 or an outside. The polarizing plate 200 may be attached on the display panel by and may be optimized for various purposes including the improvement of image quality, the limitation of a viewing angle for protection of personal information, and the like. Embodiments are not limited to the display device having the polarizing plate 200. For example, the polarizing plate 200 may be omitted or integrally formed with the display panel 100.

The adhesive 300 may be disposed between the window substrate 400 and the display panel 100 having the polarizing plate 200 to allow the display panel 100 and the window substrate 400 to be adhered to each other. The adhesive 300 may be made of, for example, a transparent resin, to allow light from the display panel 100 to be transmitted toward the window substrate 400.

The window substrate 400 may be formed of a material having a predetermined strength or greater, such as tempered glass, to protect the display panel 100 from above the display panel 100. A frame pattern layer 410 may be formed on at least one surface of the window substrate 400, e.g., a rear surface at the side of the display panel 100. The frame pattern layer 410 may have an opening through which the active area AA is exposed, and may cover at least one portion of the non-active area NAA.

The frame pattern layer 410 may be opaque and cover at least one portion including a peripheral edge in the non-active area NAA. For example, the frame pattern layer 410 may be formed by printing an opaque material along an edge of the rear surface of the window substrate 400. The frame pattern layer 410 may be black, or may be various colors except black. The frame pattern layer 410 may form an edge pattern of the display device, and thus the color of the frame pattern layer 410 may be expressed as an edge color of the display device.

If the opaque frame pattern layer 410 is formed on the window substrate 400 as described above, the inner area having the frame pattern layer 410 not formed therein may be defined as a visible area VA that may be a transparent area, and the peripheral area having the frame pattern layer 410 formed therein may be defined as a non-visible area NVA that may be opaque.

The visible area VA may be designed to overlap with the active area AA, so that a screen implemented in the active area AA is not covered by the frame pattern layer 410.

However, the visible area VA and the active area AA may not necessarily correspond to each other. For example, the visible area VA may be formed to extend up to an area including a portion of the non-active area NAA immediately adjacent to the active area AA. In this case, it may be possible to view the screen from a wide angle. In addition, it may be possible to prevent the frame pattern layer 410 from covering the screen, even if an alignment error occurs in a process of bonding together the display panel 100 and the window substrate 400.

The frame pattern layer 410 may be formed to overlap with the non-active area NAA having the opening through which the active area AA is exposed, and may be disposed to expose at least one portion of the non-active area NAA and cover the other area, in accordance with its design, process error range, etc.

The light shielding member 500 may be disposed beneath the display panel 100, and may prevent pattern leakage caused by the reflection of external light incident through the visible area VA and improve image quality. The light shielding member 500 may include a light shielding sheet 510 entirely disposed below the display panel 100, and an adhesive layer 520 disposed between the light shielding sheet 510 and the display panel 100.

The light shielding sheet 510 may be implemented as, for example, a black sheet. However, embodiments are not limited thereto, and the light shielding sheet 510 may be implemented as an opaque sheet of another color, which may block at least a portion of visible light.

The adhesive layer 520 may allow the light shielding sheet 510 to be attached to the display panel 100 between the light shielding sheet 510 and the display panel 100.

In exemplary embodiments, the adhesive layer 520 may include an opening 522 formed in at least one area between the active area AA and the non-visible area NVA in which the frame pattern layer 410 may be formed in an area corresponding to the non-active area NAA.

For example, the opening 522 may be formed in a frame shape surrounding the periphery of the active area AA, in the non-active area NAA adjacent to the active area AA. The opening 522 may have a pattern corresponding to the boundary line of the periphery of the active area AA.

According to embodiments configured as described above, the opening 522 may be formed in the adhesive layer 520 of the light shielding member 500 along at least a boundary line at the periphery of a screen outside the active area AA belonging to the visible area VA while preventing pattern leakage of the display panel 100 by attaching the light shielding member 500 beneath the display panel 100. Accordingly, light reflection in the boundary area at the periphery of the screen may be equalized, so that it may be possible to provide an effect that the boundary line is equally viewed. The position and effect of the opening 522 will be described in detail below.

Figure 2:
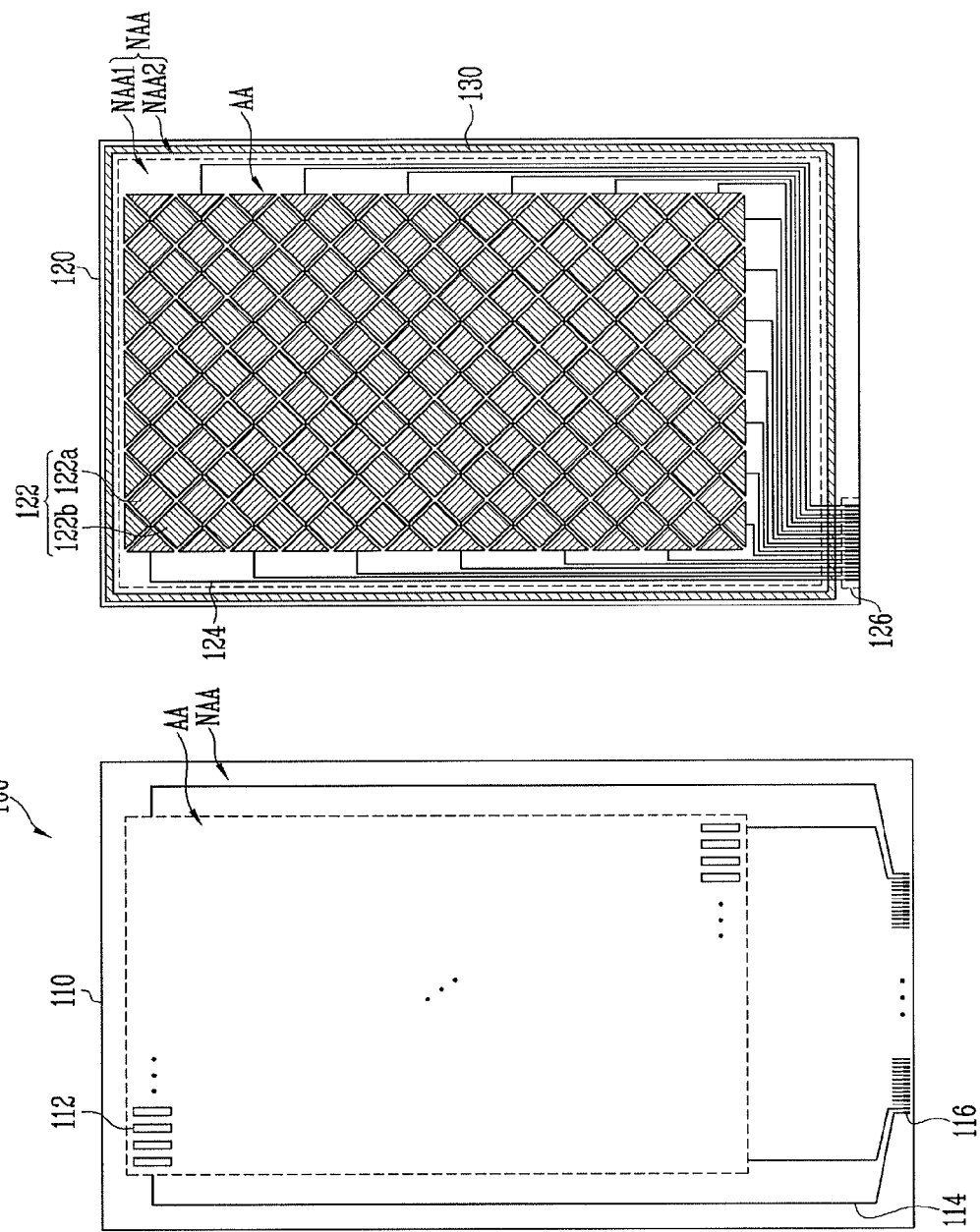
FIG. 2 illustrates a plan view showing a state in which lower and upper substrates of a display panel shown in FIG. 1 are separated.

FIG. 2 is a plan view showing a state in which the lower and upper substrates of the display panel shown in FIG. 1 are separated. For example, an organic light emitting display panel integrated with a touch screen panel, in which touch sensing patterns are formed on the upper substrate, is shown in FIG. 2. However, embodiments are not limited thereto. That is, embodiments may be applied to a display device having various types of display panels.

Referring to FIG. 2, pixels 112 may be disposed in the active area AA on the lower substrate 110, and first lines 114 for supplying a driving signal to the pixels 112 and first pads 116 for connecting the first lines 114 to an external driving circuit (not shown), etc. may be disposed in the non-active area NAA at the periphery of the active area AA.

Touch sensing electrodes 122 are disposed in the active area AA on the upper substrate 120, and touch sensing lines 124 connected to the touch sensing electrodes 122 and second pads 126 for connecting the touch sensing lines 124 to the external driving circuit, etc. are disposed in the non-active area NAA at the periphery of the active area AA. The touch sensing electrodes 122 and the touch sensing lines 124 constitute touch sensing patterns.

The touch sensing electrodes 122 may include first touch sensing electrodes 122a and second touch sensing electrodes 122b, which may be formed to be connected along different directions (e.g., X and Y directions). The touch sensing lines 124 may be respectively connected to lines of the first touch sensing electrodes 122a along the first direction or lines of the second touch sensing electrodes 122b along the second direction.

The lower and upper substrates 110 and 120 may be bonded together by a sealing material 130 formed in an edge area therebetween.

For example, the lower and upper substrates 110 and 120 may be bonded together by aligning the lower and upper substrates 110 and 120 to correspond to each other in a state in which the sealing material 130 such as a frit is coated in the outermost edge area on the rear surface of the upper substrate 120, i.e., the surface facing the lower substrate 110, and then melting and curing the sealing material 130 through the irradiation of light onto the sealing material 130. In this case, the area between the lower and upper substrates 110 and 120 including the active area AA may be hermetically sealed, so that the pixels 112 may be protected from the penetration of moisture, etc.

The non-active area NAA on the lower or upper substrate 110 or 120 may include a first non-active area NAA1 in which the plurality of lines 114 or 124 are disposed, and a second non-active area NAA2 in which the sealing material 130 is disposed at an outside of the first non-active area NAA1. For the purpose of connection to the pads 116 or 126, the lines 114 or 124 may be extended to at least one side of the second non-active area NAA2 to partially overlap with the sealing material 130.

Although the touch sensing electrodes 122 and the touch sensing lines 124 may be formed on an upper surface of the upper substrate 120, embodiments are not limited thereto. That is, the touch sensing electrodes 122 and the touch sensing lines 124 may be formed on a lower surface of the upper substrate 130, on which the sealing material 130 is formed.

If the display panel 100 is implemented as a display panel integrated with a touch screen as described above, it may be possible to provide a touch screen function and to minimize an increase in thickness of the display device.

Figure 3:
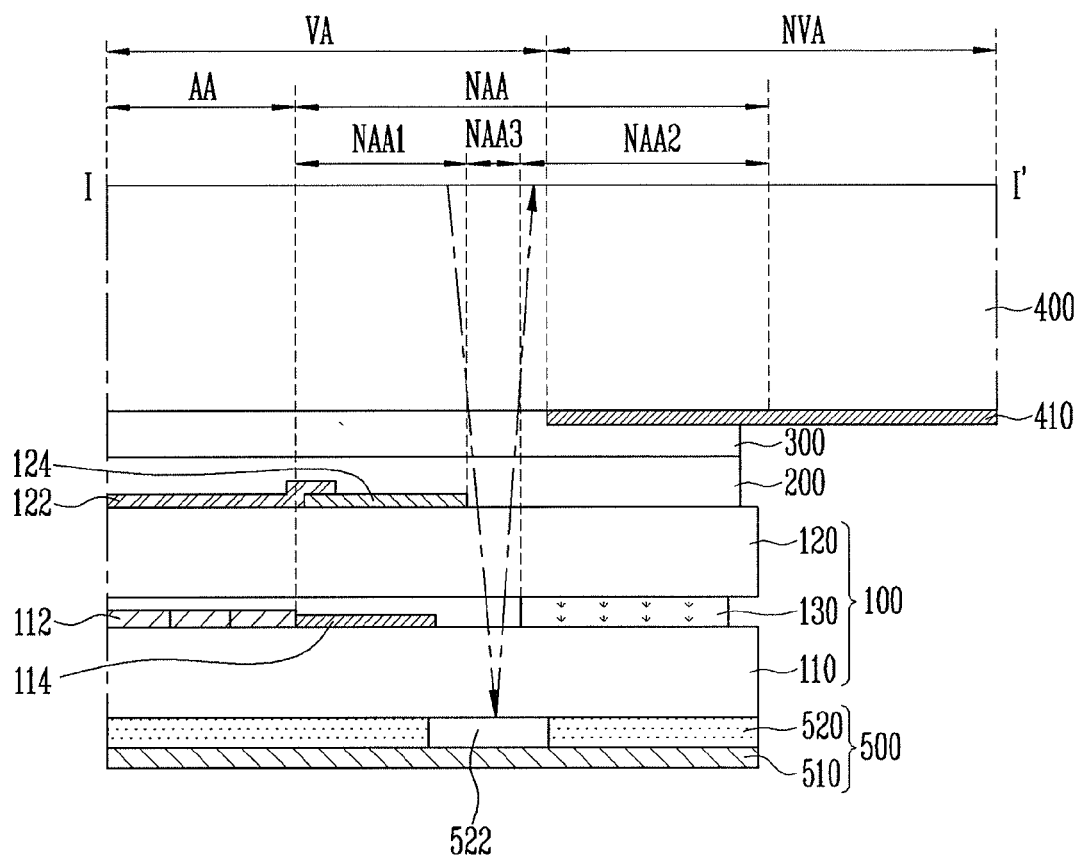
FIG. 3 illustrates a main portion sectional view of the display device shown in FIG. 1.

FIG. 3 is a main portion sectional view of the display device shown in FIG. 1. Particularly, FIG. 3 shows a main portion sectional view of the display device to which the display panel integrated with the touch screen shown in FIG. 2 is applied. For convenience, in FIG. 3, components identical or similar to those of FIGS. 1 and 2 are designated by like reference numerals, and their detailed descriptions will be omitted.

Referring to FIG. 3, the area on the display panel 100 may be divided into an active area AA and a non-active area NAA, and the non-active area NAA may be divided into first, second and third non-active areas NAA1, NAA2 and NAA3.

The pixels 112 and/or the touch sensing electrodes 122 may be disposed in the active area AA. The first lines 114 and/or the touch sensing lines 124 may be disposed in the first non-active area NAA1 immediately adjacent to the active area AA. The sealing material 130 may be disposed in the second non-active area NAA2 including an outer edge on the display panel 100.

Although not shown in FIG. 3, in a case where touch sensing patterns, such as the touch sensing electrodes 122 and the touch sensing lines 124, are formed on the upper substrate 120 of the display panel 100, a protective layer or protective film for protecting and planarizing the touch sensing patterns may be further formed on the touch sensing patterns.

Any component capable of shielding light to an extent, such as the lines 114 and 124 or the sealing material 130, may not be disposed in the third non-active area NAA3 defined between the first and second non-active areas NAA1 and NAA2. Thus, the third non-active area NAA3 may be a blank area.

The area of the display device, which may be based on the area of the window substrate 400, may be divided into a transparent visible area VA in which the frame pattern layer 410 is not formed, and an opaque non-visible area NVA of the outer edge where the frame pattern layer 410 may be formed. That is, the area on the window substrate 400 may be changed depending on the position of the frame pattern layer 410.

In this case, the frame pattern layer 410 may be disposed at an outside of the active area AA so as not to cover a screen implemented in the active area AA. The frame pattern layer 410 may be formed to have an opening the active area AA and a portion of the non-active area NAA immediately adjacent to the active area AA, in according to its design, process error range, etc. To this end, the frame pattern layer 410 may not overlap with the active area AA and the first non-active area NAA1. In this case, the pattern leakage in the first non-active area NAA1 may be at least partially shielded by the polarizing plate 200, the adhesive 300 and/or the light shielding member 500.

In order to enlarge the screen or extend an allowable alignment error range, the frame pattern layer 410 may be formed further outside the third non-active area NAA3 so as to expose at least one portion of the third non-active area NAA3.

For example, the frame pattern layer 410 may be formed further outside the third non-active area NAA3 so as not to overlap with the entire third non-active area NAA3, and may be formed to cover at least one portion of the second non-active area NAA2. In this case, the frame pattern layer 410 may be overlapped with at least one portion of the sealing material 130.

In a case where the frame pattern layer 410 is formed to expose at least one portion of the third non-active area NAA3, the boundary line at the periphery of a screen may be unequally visualized.

More specifically, the light shielding sheet 510 for preventing pattern leakage caused by the reflection of external light may be attached to the display panel 100 by the adhesive layer 520. An air-gap may be formed between the light shielding member 500 and the display panel 100 in a process of attaching the light shielding member 500 to the display panel 100.

The air-gap may be unequally formed between the light shielding member 500 and the display panel 100. In particular, in a case where the air-gap is unequally formed at a lower portion of the third non-active area NAA3 in which components capable of shielding light are not disposed, the air-gap may cause a phenomenon in which the boundary line at the periphery of the screen is unequally visualized. That is, as external light is reflected in the third non-active area NAA3 having the air-gap formed at the lower portion thereof, reflected light may be generated in the corresponding area. The external light may be absorbed into the light shielding sheet 510 in the third non-active area NAA3 not having an air-gap formed at the lower portion thereof, so that the boundary line at the periphery of the screen may be unequally visualized when being viewed from the front face of the display panel 100.

To reduce or prevent such a phenomenon, the opening 522 may be formed in at least one area of the lower portion of the third non-active area NAA3, in particular at the adhesive layer 520 at the lower portion of the third non-active area NAA3 belonging to the visible area VA, so that the air-gap may be equally formed in the area.

For example, in a case where the entire third non-active area NAA3 is part of the visible area VA, the opening 522 may be formed in an area overlapped with the third non-active area NAA3 so as to cover at least the third non-active area NAA3.

The opening 522 may be formed to extend up to the first and second non-active areas NAA1 and NAA2 so as to overlap with an area immediately adjacent to the third non-active area NAA3, i.e., a portion of an area adjacent to at least the third non-active area NAA3 in the first and second non-active areas NAA1 and NAA2. For example, the opening 522 may be extended so as to overlap with at least portions of the first lines 114 and/or the touch sensing lines 124 and the sealing material 130. In this case, it may be possible to reduce or prevent the phenomenon in which the boundary line at the periphery of the screen is unequally visualized in the third non-active area NAA3.

According to exemplary embodiments, the light reflection characteristic and the like may be equalized on a boundary line at the periphery of a screen, so that the boundary line at the periphery of the screen may be equally visualized.

Figure 4:
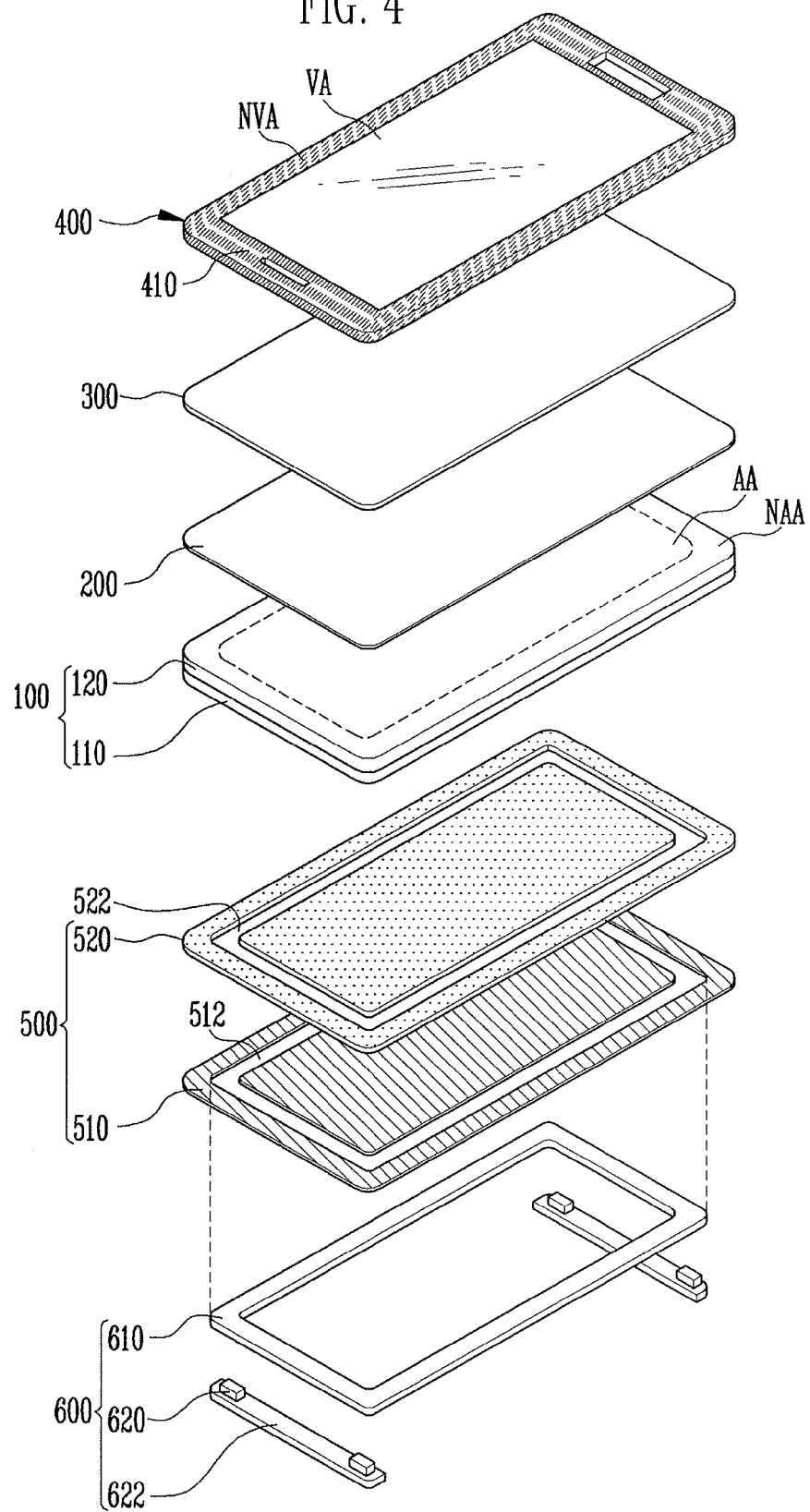
FIG. 4 illustrates an exploded perspective view of a display device according to another embodiment.

FIG. 4 is an exploded perspective view of a display device according to another embodiment. FIG. 5 is a main portion sectional view of the display device shown in FIG. 4. In the embodiment shown in FIGS. 4 and 5, components identical or similar to those of the embodiment shown in FIGS. 1 to 3 are designated by like reference numerals, and their detailed descriptions will be omitted.

Referring to FIGS. 4 and 5, an opening 512 may be formed in the light shielding sheet 510 as well as the adhesive layer 520 of the light shielding member 500.

Like the opening 522 of the adhesive layer 520, the opening 512 of the light shielding sheet 510 may be formed to overlap with the third non-active area NAA3 of the visible area VA. For example, the light shielding sheet 510 may be formed to have the opening 512 corresponding to the opening 522 of the adhesive layer 520. In this case, the openings 512 and 522 may be respectively formed in the light shielding sheet 510 and the adhesive layer 520 at the same time.

The display device according to exemplary embodiments may further include a light guide film 610 in the openings 512 and 522 of the light shielding sheet 510 and the adhesive layer 520, and one or more light sources 620 for supplying light to the light guide film 610.

The light source 620 may be configured with one or more point light sources or line light sources such as light emitting diodes (LEDs) mounted on an LED substrate 622 or the like. For example, the light sources 620 may be disposed below one or more sides of the light guide film 610, e.g., below four corners of the light guide film 610, so that light may be equally emitted through the light guide film 610.

The light guide film 610 and the light source 620 may be included in a decorative lighting unit 600 which may provide a light decoration effect to the peripheral edge of a screen. For example, as the light source 620 may be configured with one or more color LEDs, and light of a desired color may be equally leaked at the peripheral edge of the screen, thereby providing the light decoration effect. The decorative lighting unit 600 may be designed to control its on/off or brightness by being connected to the display panel 100 or the driving circuit through a separate power line (not shown) and/or a separate signal line (not shown).

According to exemplary embodiments, the openings 512 and 522 may be respectively formed in the light shielding sheet 510 and the adhesive layer 520 of the light shielding member 500 along the boundary line at the periphery of the screen immediately adjacent to the outside of the screen. In addition, the display device according to exemplary embodiments may further include the light guide film 610 inserted into the openings 512 and 522, and the decorative lighting unit 600 configured to include the light source 620 for supplying light to the light guide film 610. Accordingly, the boundary line at the periphery of the screen may be equally visualized, and the light decoration effect may be additionally provided to the boundary line, thereby increasing an aesthetic quality of the display device.

By way of summation and review, an opaque frame pattern layer for covering lines or a sealing material formed in a display panel may generally be formed on an upper layer in a non-active area. For example, the frame pattern layer may be formed along a rear edge of a window substrate provided above the display panel.

The frame pattern layer may be formed to have an opening through which at least an active area is exposed, and may be formed to have an opening through which the active area and a portion of the non-active area immediately adjacent to the active area are exposed, due to an alignment error, etc.

In contrast, in exemplary embodiments, the boundary line of a screen may be formed between the active area and the frame pattern layer. That is, exemplary embodiments may include a display device in which a boundary line at the periphery of a screen is equally visualized.

According to an embodiment, the opening may be formed in the adhesive layer of the light shielding member along at least a boundary line at the periphery of a screen outside the active area of the visible area to reduce or prevent pattern leakage of the display panel by attaching the light shielding member beneath the display panel. Accordingly, reflected light or the like may be equalized on a boundary line at the periphery of the screen, so that the boundary line at the periphery of the screen may be equally visualized.

Further, the openings may be respectively formed in the light shielding sheet and the adhesive layer of the light shielding member along at least the boundary line at the periphery of the screen. In addition, the display device may further include a light guide film inserted into the openings, and a decorative lighting unit configured to include at least one light source for supplying light to the light guide film. Accordingly, it may be possible to provide a light decoration effect to the boundary line at the periphery of the screen.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. A display device, comprising:
   a display panel including an active area including pixels and a non-active area at a periphery of the active area, the non-active area including a first non-active area including a plurality of lines, a second non-active area including a sealing material at an outside of the first non-active area, and a third non-active area between the first and second non-active areas;
   a window substrate above the display panel, the window substrate including a frame pattern layer formed thereon, wherein the frame pattern layer covers a portion including an outer edge of the non-active area, the frame pattern layer covering only a portion of the second non-active area and overlapping only a portion of the sealing material; and a light shielding member including a light shielding sheet below the display panel and an adhesive layer between the light shielding sheet and the display panel, wherein the adhesive layer includes an opening formed in at least one area between the frame pattern layer and the active area in an area corresponding to the non-active area, the opening overlapping:

an entirety of the third non-active area;
only a portion of the plurality of lines;
only a portion of the sealing material; and
only a portion of each of the first and second non-active areas adjacent to the third non-active area.

2. The display device as claimed in claim 1, wherein the opening has a shape surrounding the periphery of the active area and has a pattern corresponding to a boundary line at the periphery of the active area.

3. The display device as claimed in claim 1, wherein the light shielding sheet includes an opening corresponding to the opening of the adhesive layer.

4. The display device as claimed in claim 3, further comprising a decorative lighting unit including a light guide film in the openings of the light shielding sheet and the adhesive layer, and a light source for supplying light to the light guide film.

5. The display device as claimed in claim 4, wherein the light source is below at least one side of the light guide film.

6. The display device as claimed in claim 4, wherein the light source includes one or more color light emitting diodes (LEDs).

7. The display device as claimed in claim 1, wherein the display panel further comprises upper and lower substrates, a sealing material bonding together the upper and lower substrates in an edge area between the upper and lower substrates, and touch sensing patterns on the upper substrate.

8. The display device as claimed in claim 7, wherein the touch sensing patterns include touch sensing electrodes in the active area and touch sensing lines in the non-active area to be connected to the touch sensing electrodes.

9. The display device as claimed in claim 8, wherein the opening overlaps an area between an area including the touch sensing lines and an area including the sealing material.

10. The display device as claimed in claim 8, wherein the opening extends to overlap with at least only portions of the touch sensing lines and the sealing material and covers an area between an area including the touch sensing lines and an area including the sealing material.

11. The display device as claimed in claim 1, wherein:
the display panel further comprises upper and lower substrates, and
the adhesive layer including the opening is directly adhered to the lower substrate.

12. The display device as claimed in claim 1, wherein the opening is in a visible area of the non-active region.

* * * * *